(12) United States Patent
Bellorado et al.

(10) Patent No.: US 8,477,537 B2
(45) Date of Patent: *Jul. 2, 2013

(54) WRITE-PRECOMPENSATION AND VARIABLE WRITE BACKOFF

(75) Inventors: Jason Bellorado, Santa Clara, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/316,042

(22) Filed: Dec. 9, 2011

(65) Prior Publication Data

US 2012/0127799 A1    May 24, 2012

Related U.S. Application Data

(63) Continuation of application No. 12/386,004, filed on Apr. 9, 2009, now Pat. No. 8,094,502.

(60) Provisional application No. 61/123,554, filed on Apr. 9, 2008.

(51) Int. Cl.
*G11C 11/34* (2006.01)

(52) U.S. Cl.
USPC ............ 365/185.18; 365/185.03; 365/185.09; 365/185.23; 365/189.011; 365/189.07; 365/230.04; 365/230.06

(58) Field of Classification Search
USPC ............. 365/185.18, 185.03, 185.09, 185.23, 365/189.011, 189.07, 230.04, 230.06; 711/101
See application file for complete search history.

(56) References Cited

U.S. PATENT DOCUMENTS

| | | | |
|---|---|---|---|
| 7,679,977 B2 * | 3/2010 | Shirakawa | 365/201 |
| 7,904,793 B2 * | 3/2011 | Mokhlesi et al. | 714/780 |
| 2007/0189073 A1 * | 8/2007 | Aritome | 365/185.18 |
| 2007/0198766 A1 * | 8/2007 | Mizukami et al. | 711/101 |
| 2009/0034337 A1 * | 2/2009 | Aritome | 365/185.18 |
| 2009/0113259 A1 * | 4/2009 | Aritome | 714/721 |
| 2011/0055670 A1 * | 3/2011 | Hung et al. | 714/799 |

* cited by examiner

*Primary Examiner* — Fernando Hidalgo
(74) *Attorney, Agent, or Firm* — Van Pelt, Yi & James LLP

(57) ABSTRACT

A technique for writing data is disclosed. The technique includes estimating an amount of additional voltage on a victim cell of a solid-state storage device caused by writing to one or more other cells in the solid-state storage device, determining a modified write value for the victim cell based at least in part on a desired value for the victim cell and the estimated amount of additional voltage, and writing the modified write value to the victim cell.

21 Claims, 9 Drawing Sheets

WRITE-PRECOMPENSATION AND VARIABLE WRITE BACKOFF

CROSS REFERENCE TO OTHER APPLICATIONS

This application is a continuation of co-pending U.S. patent application Ser. No. 12/386,004, entitled WRITE-PRECOMPENSATION AND VARIABLE WRITE BACKOFF filed Apr. 9, 2009 which is incorporated herein by reference for all purposes, which claims priority to U.S. Provisional Application No. 61/123,554, entitled CHARACTERIZING AND PARAMETERIZING INTER-SYMBOL INTERFERENCE IN SOLID-STATE STORAGE DEVICES AND MITIGATING ITS AFFECT THROUGH WRITE-PRECOMPENSATION AND VARIABLE WRITE BACKOFF filed Apr. 9, 2008 which is incorporated herein by reference for all purposes.

BACKGROUND OF THE INVENTION

A solid-state storage device typically comprises large arrays of transistors (cells). Information is stored in each cell by placing an electric potential onto its floating-gate. Due to the close physical proximity of the cells, the application of a voltage to an individual transistor induces a coupling effect which acts to place additional charge on nearby cells. This phenomenon (referred to as inter-symbol interference (ISI) in communication theory literature) accounts for the dominant source of noise encountered during the process of reading back (and decoding) the written voltage levels. Furthermore, the advancement of process technology (which will inevitably reduce the size of and spacing between adjacent transistors) will only act to increase this coupling between adjacent cells.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A method for the characterization and parameterization of the inter-symbol interference inherent to the write-process utilized in solid-state storage devices is disclosed. Utilizing this parameterized model of the inter-symbol-interference, several methods for its mitigation are disclosed.

Figure 1:
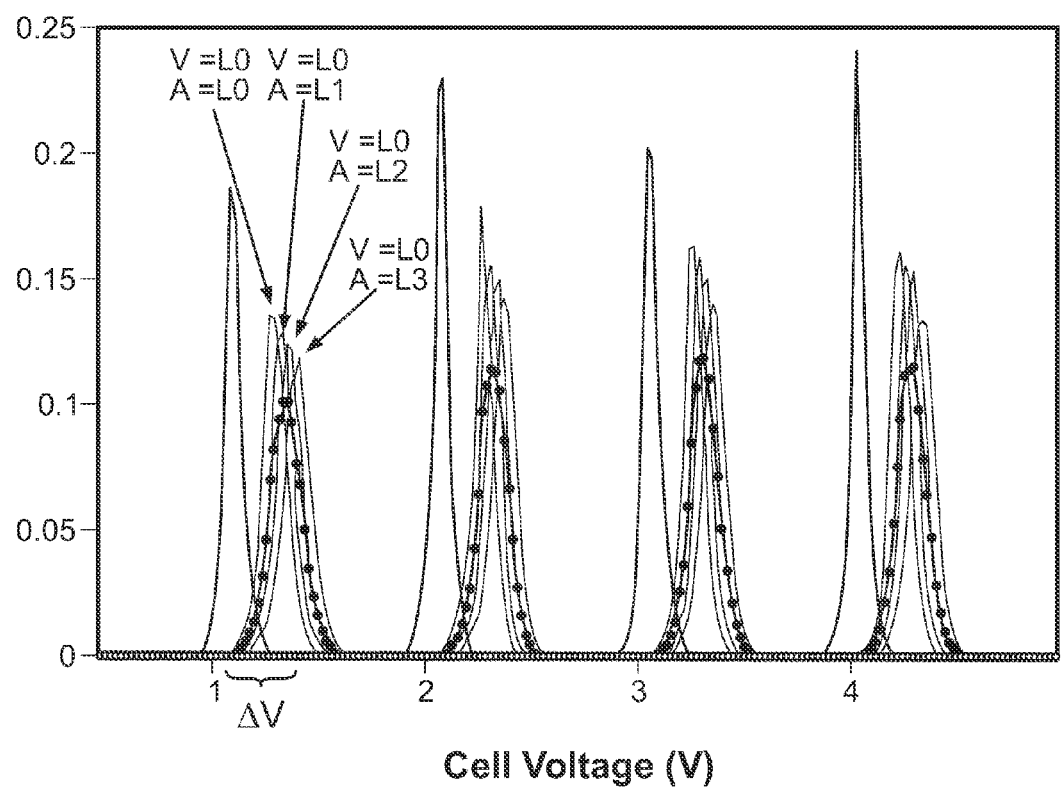
FIG. 1 is a diagram illustrating an example of NAND flash data showing the ISI incurred by a victim cell due to aggressor cells written to various voltage levels.

FIG. 1 is a diagram illustrating an example of NAND flash data showing the ISI incurred by a victim cell due to aggressor cells written to various voltage levels. The thick solid lines without markers show the histograms of the 4 written levels without ISI. The thick solid lines with markers show the histograms of the 4 written levels with ISI. In this particular example, the cells have 2-bits storage capacity and can store 4 levels. Some other systems store a different number of levels or bits. As shown, conditional on the magnitude of the aggressor cell voltage, the original (pre-ISI) distribution is shifted (increased mean), however, is not significantly broadened (increased variance). For example, the mean voltage level for level 0 (L0) has been shifted by $\Delta V$, as shown in the diagram, but the variance remains substantially the same.

Besides NAND Flash, in various embodiments, the techniques disclosed herein are applicable to any system that utilizes a geometry similar to NAND Flash (i.e., cells placed in a regular array).

Additionally, the histograms post-ISI are broken into its constituent histograms as shown by the thin lines (the victim (V) and aggressor (A) cells are indicated for victim level 0 (L0)). For example, for the V=L0, A=L3 combination, a level 0 is written to the victim and a level 3 is written to the aggressor. As used herein, the victim cell is the cell whose voltage is affected by an aggressor or interfering cell. As used herein, the terms victim cell and affected cell may be used interchangeably. This data supports the following write properties.

In the examples herein, the following (empirically determined) properties of the write process are utilized:

Property 1. The magnitude of the voltage increase induced on a (victim) cell due to the write-process (placing an electric potential on its floating-gate) of an interfering (e.g., adjacent) cell is only a function of the change in voltage of the interfering cell and of its relative proximity to that cell.

Property 2. The magnitude of the voltage increase induced on a cell due to the write-process of an adjacent cell is largely deterministic (i.e., if the floating-gate of a cell is increased in voltage by a fixed amount many times, the effect on its neighbors is largely repeatable (has negligible variation as compared to its mean increase in voltage), as is illustrated by the data shown in FIG. 1). Stated another way, the variance does not change significantly in FIG. 1 pre-ISI and post-ISI for each of the four levels.

Since the magnitude of the voltage increase as a result of ISI is largely deterministic (Property 2) and the relationship is known (Property 1), the effect of inter-symbol interference in solid-state storage devices may be largely eliminated through use of the presented methodologies.

Utilization of the methods described herein allow for a voltage to be more accurately written to the floating-gate of a solid-state storage cell without being detrimentally affected by the write-process as conducted on neighboring cells. In doing so, a large portion of the read-back noise is eliminated, allowing for a more accurate representation of the intended voltage level written to a given cell. This permits storage of a greater number of voltage levels in a single cell during the write process, thus increasing the overall capacity of the storage device.

Figure 2:
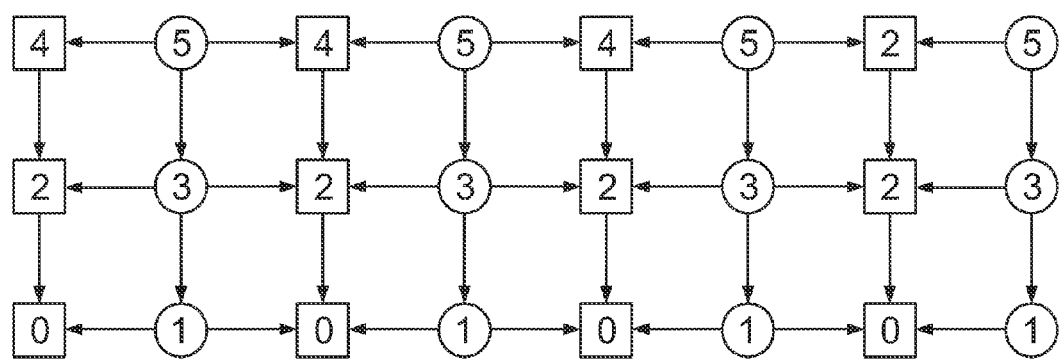
FIG. 2 is a diagram illustrating an embodiment of a physical layout of cells within a solid-state storage device cell-array (block).

FIG. 2 is a diagram illustrating an embodiment of a physical layout of cells within a solid-state storage device cell-array (block). The cells along the horizontal dimension (word-line) are broken into 2 interleaved (logical) pages. Each cell is labeled with the page to which it belongs and the direction of ISI is indicated by arrows (tail indicates interfering cell and head indicates victim cell).

A solid-state storage device comprises a large array of transistors that are laid out (physically) as shown. Here, the string of transistors along the horizontal dimension are part of the same word-line, and are broken up (logically) into a number of pages. In the example shown, each word-line is broken into 2 interleaved logical pages, labeled as 2k and 2k+1. Along the vertical dimension, each string of transistors is referred to as a bit-line. The write-process starts by simultaneously writing all cells in page 0, and proceeds in increasing numerical order through the pages until the entire block (consisting of many word-lines) is written. Since inter-symbol interference is the effect caused by writing a cell on an adjacent cell which has already been written to its intended value, the arrows included in the diagram indicate the interferer cells (tail of the arrow) and the victim cells (head of the arrow). As can be seen, even-pages, which are written first among the cells in a word-line, are affected both by cells in the odd-pages in that same word-line and by cells in the even-page of the next word-line. Conversely, odd-pages, which are written last among cells in a word-line, are affected only by cells in the odd-page of the next word-line. Note that in some instances, a word-line may be broken into many interleaved logical pages (as more fully described below), however, the examples presented herein may be easily extended to that case.

Figure 3:
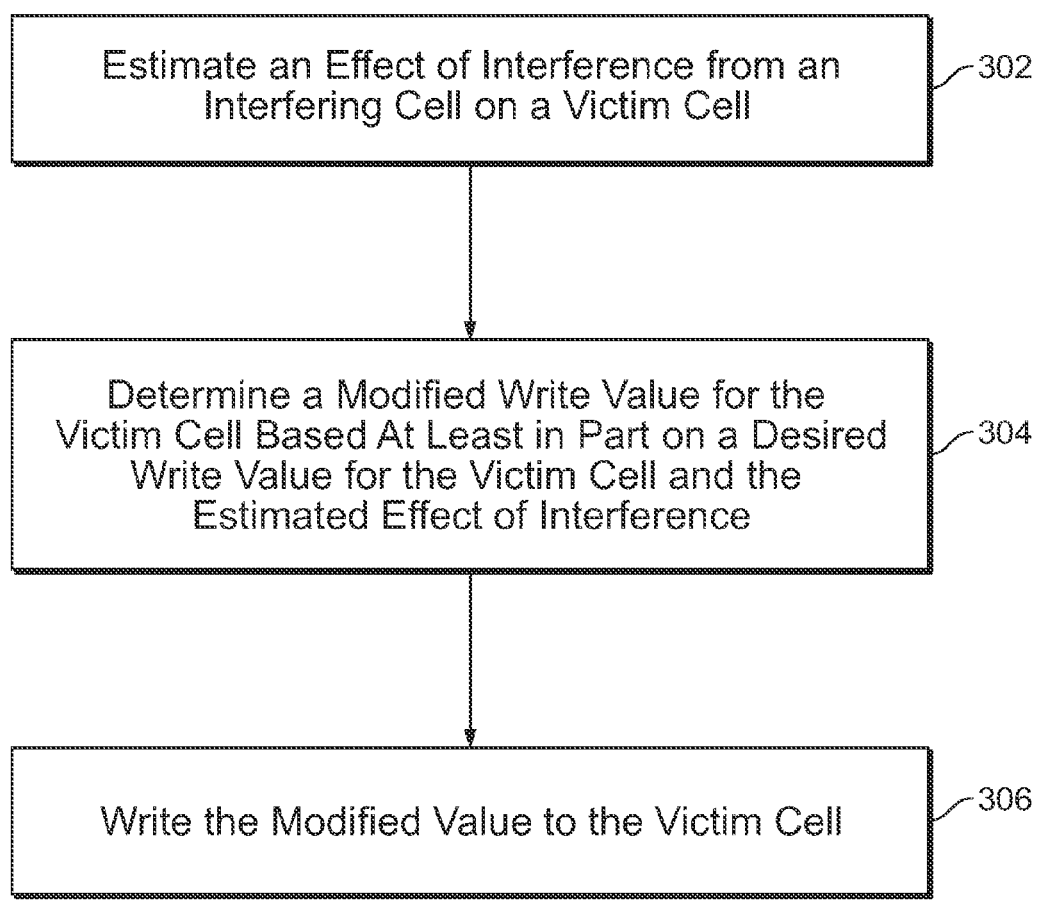
FIG. 3 is a flow chart illustrating an embodiment of a process for writing data to a cell in a solid-state storage device.

FIG. 3 is a flow chart illustrating an embodiment of a process for writing data to a cell in a solid-state storage device. At 302, an effect of interference from an interfering cell on a victim cell is estimated. For example, interference causes the voltage stored by a victim cell to increase by $\Delta V$ and in some embodiments step 302 includes estimating the value of $\Delta V$. A variety of techniques may be used to estimate the effect of interference. Example techniques will be described more fully below. At 304, a modified write value for the victim cell is determined based at least in part on a desired write value for the victim cell and the estimated effect of interference. For example, the modified write value could compensate for the effect of interference by subtracting from a desired write value an expected voltage change due to interference (e.g., $\Delta V$). Further examples are more fully described below. At 306, the modified write value is written to the victim cell.

Figure 4:
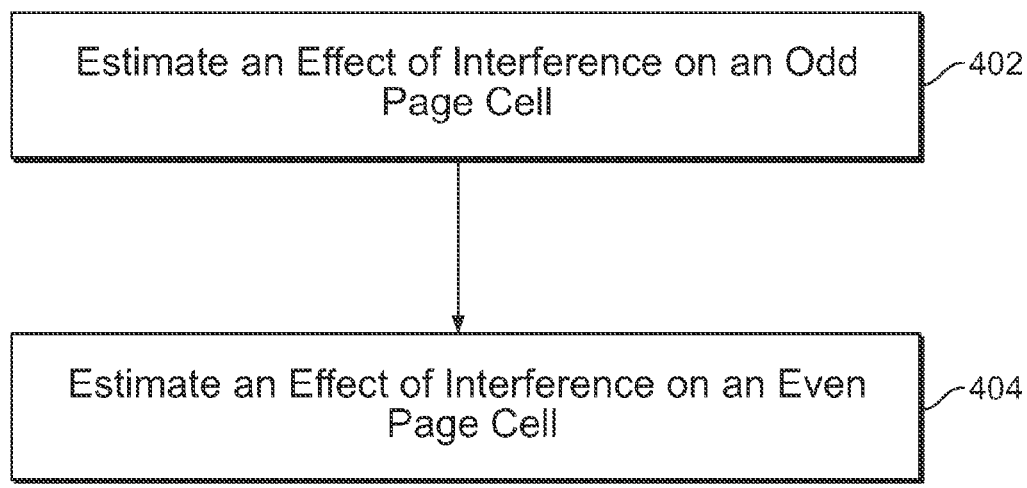
FIG. 4 is a flow chart illustrating an embodiment of a process for estimating an effect of interference from an interfering cell.

FIG. 4 is a flow chart illustrating an embodiment of a process for estimating an effect of interference from an interfering cell. In some embodiments, this process is used to perform 302 in FIG. 3. Storing information in a cell is accomplished by raising the voltage of the floating-gate of a transistor to one element of a finite signal-set of voltages, denoted here by $S=\{s_1, \ldots, s_L\}$. For example, if the desired level is s3, the voltage of the floating-gate is first raised to $s_1$, then to $s_2$, and finally to $s_3$. Because each interleave of a word-line is affected differently by inter-symbol interference, the ISI induced on each is considered separately. In the example given in FIG. 2, the odd-pages are only affected by cells in the odd-page written directly above it. A different configuration may result in different patterns of interference. This ISI is characterized using the following sequence of steps.

At 402, an effect of interference on an odd page cell is estimated. As shown in FIG. 2, odd page cells (cells labeled 1, 3, and 5) are only victims to the interfering cell directly above them, at least in the example of FIG. 2. At 404, an effect of interference on an even page cell is estimated. As shown in FIG. 2, even page cells in the configuration shown in FIG. 2 (cells labeled 0, 2, and 4) are victims to the cell vertically above them as well as horizontally neighboring cells on both sides.

In some embodiments, 402 is performed as follows:
1. Initialize sets $\Delta_{s_j} = \emptyset$, $\forall_{s_j} \in S$.
2. Write odd-page 2k+1 using a vector of voltage levels selected randomly from signal-set S, which is denoted here by $s_{(2k+1)} = (s_{(2k+1, 1)}, \ldots, s_{(2k+1, N)})$.
3. Read back odd-page 2k+1 multiple times and average the resultant read-back levels. Store these values in read-back vector $r_{(2k+1)}^{(a)}$.
4. Write odd-page 2k+3 (directly above odd-page 2k+1) using a vector of voltage levels selected randomly from signal-set S, which is denoted here by $s_{(2k+3)} = (s_{(2k+3, 1)}, \ldots, s_{(2k+3, N)})$.
5. Read back odd-page 2k+1 multiple times and average the resultant read-back levels. Store these values in read-back vector $r_{(2k+1)}^{(b)}$.
6. Compute the ISI incurred by odd-page (2k+1) as $\delta = (\delta_1, \ldots, \delta_N) = (r_{(2k+1)}^{(b)} - r_{(2k+1)}^{(a)})$, and store as a function of the levels written into page (2k+3), i.e.

$$\Delta_{(s_j, 2k+1)} = \{\underline{\delta}_k | s_{(2k+3, k)} = s_j\}.$$

7. Augment sets $\Delta_{s_j}$ as $$\Delta_{s_j} = \Delta_{s_j} \cup \Delta_{(s_j, 2k+1)}.$$

8. Repeat steps 3-7 with odd-page numbers incremented by 2 each time.

In other words, at step 2, values are written to an odd page (e.g., page 1). At step 3, values are read back from the odd page multiple times and averaged. In some embodiments, at step 3, odd page 2k+1 is read back 2-3 times to obtain baseline read values. At step 4, values are written to the interfering page (e.g., page 3). At step 5, values are read back from the odd (victim) page multiple times and averaged to obtain interfered read values. In some embodiments, at step 5, odd page 2k+1 is read back 2-3 times. Thus, it can be determined how much of a change in voltage is induced on the odd page by the interfering page by taking the difference between baseline read values (i.e., pre-interference) and interfered read values (i.e., post-interference) and storing this as a function of the values written to the interfering cell, at step 6. At step 7, the set is added to the total set. At step 8, steps 3-7 are repeated. In other words, these steps are performed for the next odd page (e.g., page 3).

The result of these steps is a set of values which indicate the interference induced on an odd-page cell by writing each level in S directly above it. Since the mean value of the ISI induced by writing an adjacent cell is the objective of this procedure, these sets are first converted to mean values, i.e.

$$m_{s_i} = \text{mean}(\Delta_{s_i}).$$

It was determined (empirically) that the ISI induced is linear in the value written to an adjacent cell and, at least in this example, these means are parameterized as a slope and a y-intercept of the ISI values. In this example, a least-squares fit is employed which takes the x-vector $(s_1, s_2, \ldots, s_L)$ and y-vector $(m_{s_1}, m_{s_2}, \ldots, m_{s_L})$ and produces the (slope, y-intercept) pair $(sl_1^{(a)}, b_1^{(a)})$ of the line which minimizes the mean-squared error between itself and the provided data points.

In other words, the mean induced change in voltage on the victim cell is plotted as a function of the voltage written to the interfering cell. An example of this is shown in FIG. 5.

Figure 5:
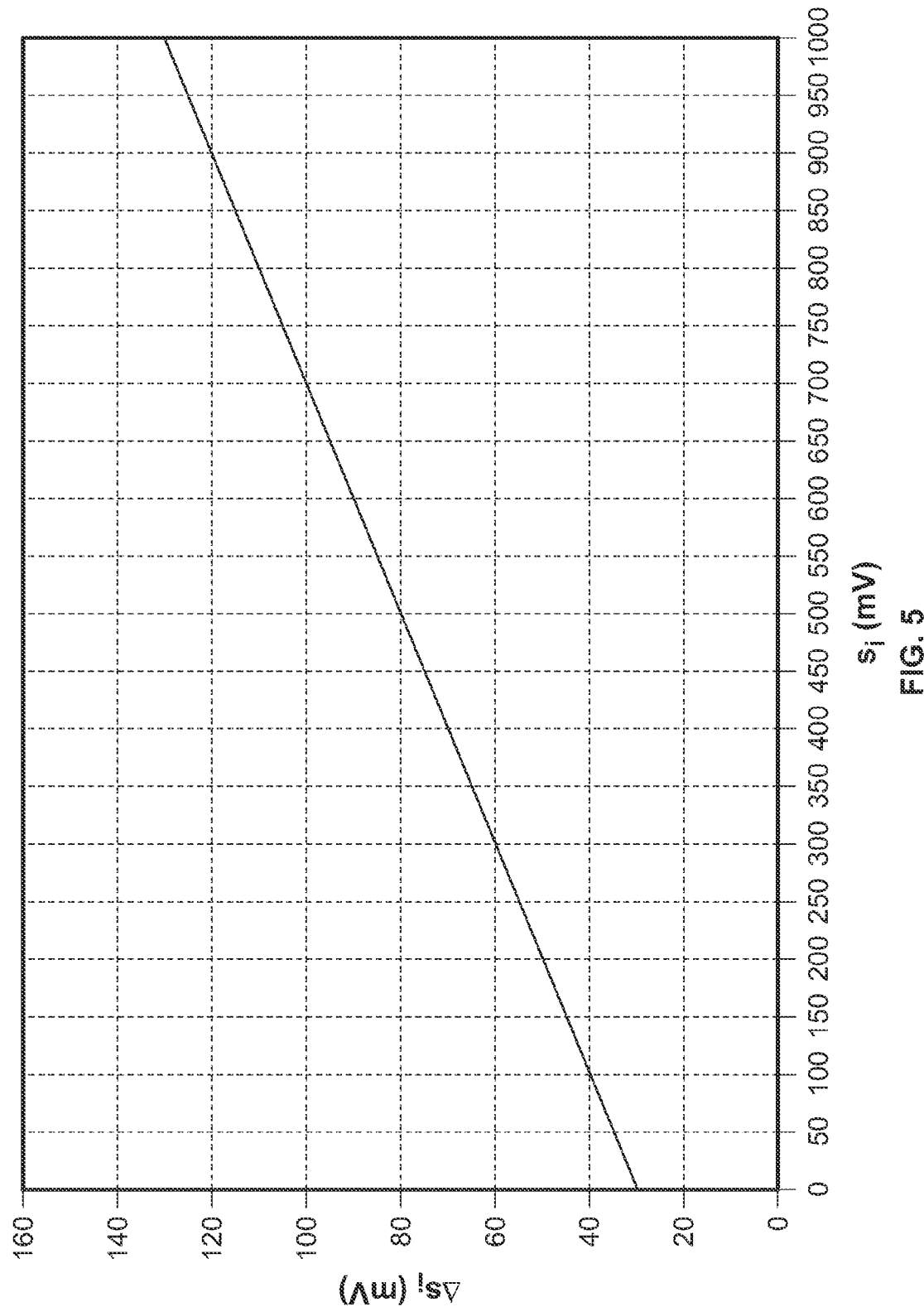
FIG. 5 is a plot illustrating an example of data collected from ISI characterization for the case where an odd page cell is the victim.

FIG. 5 is a plot illustrating an example of data collected from ISI characterization for the case where an odd page cell is the victim. Here, the signal set S={0, 50, 100, . . . , 1000} mV, is plotted on the x-axis, and the change in victim cell voltage $(\Delta_{si})$ is plotted on the y-axis. The slope and y-intercept of the least-squares line-fit are 30 mV and 0.10 mV, respectively. For example, writing a value of 300 mV on an interfering cell (e.g., page 3) induces a change in voltage on a victim cell (e.g., page 1) of 60 mV.

Characterizing the ISI induced on even pages is an extension of the method used to characterize the ISI induced on odd pages. Returning to FIG. 4, in some embodiments, 404 is performed as follows:
1. Initialize sets $\Delta_{s_i,\downarrow} = \Delta_{s_i,\rightarrow} = \Delta_{si,\leftarrow} = \emptyset, \forall s_i \in S$.
2. Write even-page 2k using a vector of voltage levels selected randomly from signal-set S, which is denoted here by $s_{(2k)} = (s^{(2k, 1)}, \ldots, s_{(2k, N)})$.
3. Read back even-page 2k multiple times and average the resultant read-back levels. Store these values in read-back vector $r_{(2k)}^{(a)}$.
4. Write odd-page 2k+1 (on the same word-line as even-page 2k) using a vector of voltage levels selected randomly from signal-set S on only the odd indices (set all even indexed symbols to 0). This vector of write levels, denoted by $s_{(2k+1)}$, is of the form $s_{(2k+1)} = (s_{(2k+1, 1)}, 0, s_{(2k+1, 3)}, 0, s_{(2k+1, 5)}, 0, \ldots, 0, s_{(2k+1, N)})$.
5. Read back even-page 2k multiple times and average the resultant read-back levels. Store these values in read-back vector $r_{(2k)}^{(b)}$.
6. Write even-page 2k+2 (directly above even-page 2k+2) using a vector of voltage levels selected randomly from signal-set S, which is denoted here by $s_{(2k+2)} = (s_{(2k+2, 1)}, \ldots, s_{(2k+2, N)})$.
7. Read back even-page 2k multiple times and average the resultant read-back levels. Store these values in read-back vector $r_{(2k)}^{(c)}$.
8. Compute the ISI incurred by even-page 2k in the vertical direction as $\delta = (\delta_1, \ldots, \delta_N) = (r_{(2k)}^{(c)} - r_{(2k)}^{(b)})$, and store as a function of the levels written into page (2k+2), i.e.

$$\Delta_{(s_i, 2k, \downarrow)} = \{\underline{\delta}_k | s_{(2k+2, k)} = s_i\}.$$

9. Augment sets $\Delta_{s_i, \downarrow}$ as $$\Delta_{s_i, \downarrow} = \Delta_{s_i, \downarrow} \cup \Delta_{(s_i, 2k, \downarrow)}.$$

Figure 6:
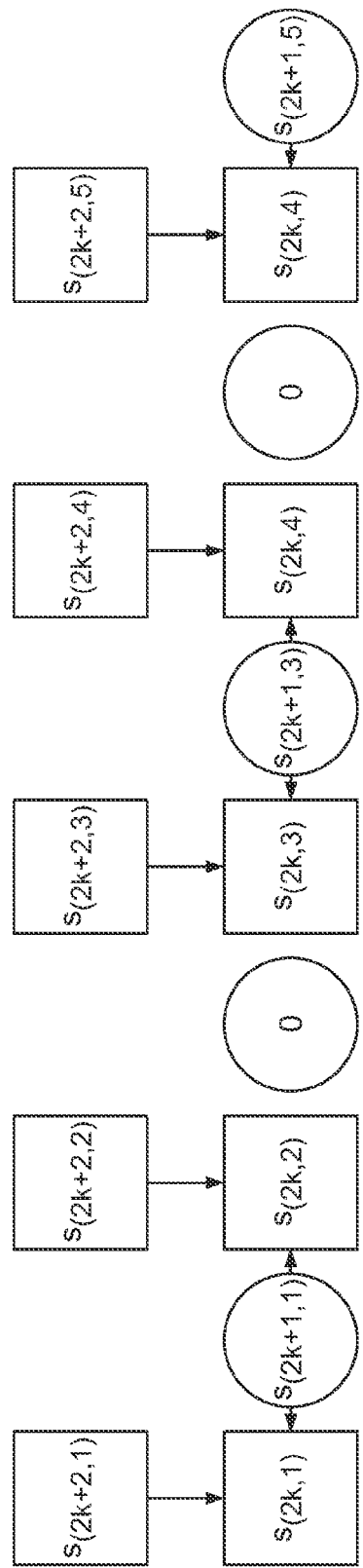
FIG. 6 is a diagram showing the cells written during the characterization of even-page ISI.

STOP 10. Compute the ISI incurred by even-page 2k in the horizontal direction. As shown in FIG. 6, each (non-zero) cell written on odd-page 2k+1 induces left-to-right ISI on one even-page cell, and right-to-left ISI on one even-page cell (no even-page cell receives both left-to-right and right-to-left ISI). The horizontal ISI induced on even-page 2k is computed as $\delta = (\delta_1, \ldots, \delta_N) = (r_{(2k)}^{(b)} - r_{2k}^{(a)})$, and store as a function of the levels written into page (2k+1) as, $$\Delta_{(si, 2k, \leftarrow)} = \{\underline{\delta}_k | s_{(2k+1, k)} = s_i, k \text{ odd}\}$$

$$\Delta_{(s_i, 2k, \rightarrow)} = \{\underline{\delta}_k | s_{(2k+1, k)} = s_i, k \text{ even}\}.$$

11. Augment sets $\Delta_{s_i, \leftarrow}$ and $\Delta_{s_i, \rightarrow}$ as $$\Delta_{s_i, \leftarrow} = \Delta_{s_i, \leftarrow} \cup \Delta_{(s_i, 2k, \leftarrow)}$$

$$\Delta_{s_i, \rightarrow} = \Delta_{s_i, \rightarrow} \cup \Delta_{(s_i, 2k, \rightarrow)}.$$

12. Repeat steps 3-11 with even-page numbers incremented by 2 each time.

In other words, for the case of characterizing ISI induced on even pages, ISI from the left, right, and above are separately characterized. This is because, as shown in FIG. 2, for even pages (e.g, page 0), a change in voltage is induced by three neighbors: the even page above it (e.g., page 2), and the two odd pages in the same line (e.g., horizontal ISI from page 1).

FIG. 6 is a diagram showing the cells written during the characterization of even-page ISI. By writing every other odd-page cell, each even-page cell is affected by either left-to-right ISI or right-to-left ISI, but not both. In this way, left-to-right ISI and right-to-left ISI may be characterized separately.

The result of the above steps is a set of values for each write-level in S which specify the vertical and horizontal (in both directions) ISI incurred by even-pages during the write process. As with the odd-pages, a least-squares line fit is utilized to produce a (slope, y-intercept) pair for each of the 3 even-page ISI sources. These pairs are, hereafter, denoted by $(sl_\downarrow^{(e)}, b_\downarrow^{(e)}))$, $(sl_\leftarrow^{(c)}, b_\leftarrow^{(c)})$, and $(sl_\rightarrow^{(c)}, b_\rightarrow^{(c)})$ for vertical, right-to-left horizontal, and left-to-right horizontal even-page ISI, respectively. In other words, a plot similar to that shown in FIG. 5 may be determined for each of the vertical, right-to-left horizontal, and left-to-right horizontal even-page ISI. Then, given the voltage levels that will be written above, to the left, and to the right of an even-paged victim cell, the interference from each interfering cell can be calculated or otherwise estimated and compensated for.

Figure 7:
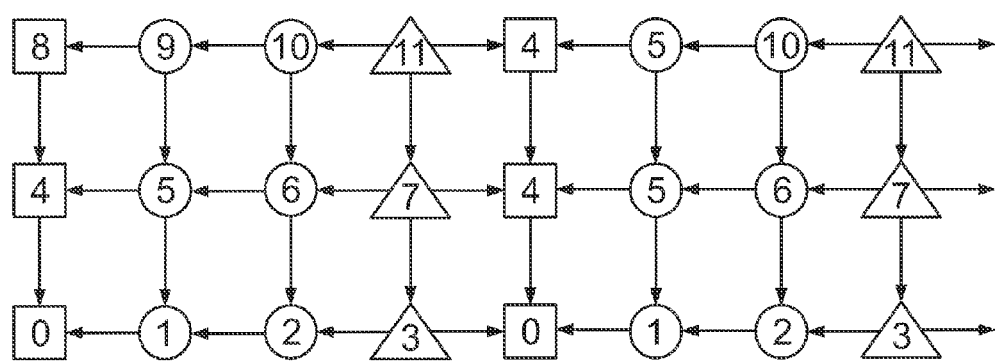
FIG. 7 is a diagram illustrating an example of a physical layout of cells within a solid-state storage device cell-array (block), in which the cells along the horizontal dimension (word-line) are broken into 4 interleaved (logical) pages.

FIG. 7 is a diagram illustrating an example of a physical layout of cells within a solid-state storage device cell-array (block), in which the cells along the horizontal dimension (word-line) are broken into 4 interleaved (logical) pages. Each cell is labeled with the page to which it belongs and the direction of ISI is indicated by arrows (tail indicates interfering cell and head indicates victim cell).

The previous examples have shown a 2-page interleave (i.e., even and odd pages). It is possible, however, to extend these techniques to any number of interleaves, such as the 4-page interleave example provided in FIG. 7. Note here that pages 4k and 4k+3, k=1, 2, . . . , have identical ISI profiles as the even and odd pages, respectively, in the 2-page interleave example. Furthermore, pages 4k+1 and 4k+2, k=0, 1, 2, . . . have the same ISI profiles as each other, i.e., only right-to-left ISI and vertical ISI. Thus, it is a straightforward extension of the ideas presented above to fully characterize the ISI profiles for these pages as well.

Mitigating Inter-Symbol Interference with Write-Precompensation

Write-precompensation refers to the process of modifying the intended write levels as a function of the data to be written. In this context, write-precompensation is utilized to anticipate the effect of ISI caused by the solid-state write process so that after interference the post-interference level is at the desired level. The method presented herein consists of 2-steps, and commences with precompensating the odd-pages. Since each cell written to an odd-page is affected only by the cell in the odd-page written directly above it (this example goes through the 2-page interleave case), the expected ISI (as characterized using the methods described in the preceding section) induced by the upper-cell is first removed from the intended voltage level of the lower-cell. Using the notation $$v(sl, b, s_i) = sl \cdot s_i + b, \quad (1)$$

the write level for odd-page cell $c_{(2m+1, n)}$ (the $n^{th}$ cell of page 2m+1) is modified as, $$\tilde{s}_{(2m+1, n)} = s_{(2m+1, n)} - v(sl_\downarrow^{(o)}, b_\downarrow^{(o)}, \tilde{s}_{(2m+3, n)}) \quad (2)$$

where $\tilde{s}_{(2m+1, n)}$ is the precompensated write-level of cell $c_{(2m+1, n)}$. Note here that no ISI is incurred by the odd-page cells on the top word-line and, thus, no precompensation is required. This process, therefore, is carried out in some embodiments starting from the top word-line and ending at the bottom word-line.

In some cases, the difference between precompensated write level ($\tilde{s}_{(2m+1, n)}$) and the intended write level ($s_{(2m+1, n)}$) is small. In some embodiments, this technique described above may be simplified by making this assumption and utilizing the following precompensation equation $$\tilde{s}_{(2m+1, n)} = s_{(2m+1, n)} - v(sl^{(o)}, b^{(o)}, s(2m+3, n)), \quad (3)$$

without a significant loss in performance.

With the odd-page cells properly precompensated, the even-page cells are next considered. In this case, three sources of ISI are considered (vertical, left-to-right, and right-to-left) since a 2-page interleave example is being demonstrated. An even-page cell is precompensated as, $$\tilde{s}_{(2m, n)} = s_{(2m, n)} - v(sl_\downarrow^{(e)}, b_\downarrow^{(e)}, \tilde{s}_{(2m+2, n)}) - v(sl_\rightarrow^{(e)}, b_\rightarrow^{(e)}, \tilde{s}_{(2m+1, n)}) - v(sl_\leftarrow^{(e)}, b_\leftarrow^{(e)}, \tilde{s}_{(2m+1, n+1)}). \quad (4)$$

As described above, this precompensation equation may be localized as follows, $$\tilde{s}_{(2m, n)} = s_{(2m, n)} - v(sl_\downarrow^{(e)}, b_\downarrow^{(e)}, s_{(2m+2, n)}) - v(sl_\rightarrow^{(e)}, b_\rightarrow^{(e)}, s_{(2m+1, n)}) - v(sl_\leftarrow^{(e)}, b_\leftarrow^{(e)}, s_{(2m+1, n+1)}). \quad (5)$$

Multiple-Pass Write Schemes using Write-Precompensation and Variable Backoff

One method for the mitigation of inter-symbol interference is to use a multiple-pass write scheme. In such, a block of data is first written, for a positive value $\eta$ (referred to herein as a backoff), to voltages $\hat{s}_i$, $$\hat{s}_i = s_i - \eta. \quad (6)$$

In doing so, the ISI incurred by each cell will act to raise its voltage closer to (but hopefully not exceeding) its final intended voltage level $s_i$. A second pass of writing is then utilized to raise each cell to its final intended voltage level (this methodology may be extended to any number of write-passes).

The reasoning behind this write strategy is based on Property 1 provided above. Here, the assumption made is that the increase in voltage required during the second (and subsequent) write-passes will be smaller than that required in previous passes and, thus, the ISI induced in these passes with be correspondingly smaller. Here, the value of $\eta$ is carefully chosen (note that this value may be determined using the write-characterization described in above) such that the ISI incurred by each cell does not cause it to exceed its final intended write level. Utilization of too small a value of $\eta$ will allow the ISI to cause some cells to exceed their final intended voltage levels, whereas utilization of too large a value of $\eta$ will make the residual ISI incurred during the next write-pass to be significant. In current technology, a value of $\eta$ determined to work well is around 750 mV.

In some cases, precompensation of the write-process in such multiple-stage write schemes is complicated by the fact that each cell will (due to incurred ISI) require a variable amount of voltage increase during the second write-pass to reach its final intended voltage level (the value will lie between 0 and $\eta$ volts). Therefore, in this case, the proper precompensation value for a given cell may be only ascertained by reading its adjacent cells after each write-pass and precompensating for the next pass using these values (this process can be both time and memory intensive and, thus, is not an attractive solution to this problem). Note that, in the event that the cells are able to be readback after the first pass, the disclosed techniques can be applied to the second pass as well.

For such write schemes, two solutions are disclosed:

1. Write Precompensation (as described in the preceding section) is utilized during the first write-pass. In doing so, each cell may be written much more accurately to its first-pass value $\hat{s}_i$. The value of $\eta$ utilized will, thus, reflect this, and be chosen to be smaller than without the use of write-precompensation. It has been determined (empirically) that a value of $\eta$ around 120 mV may be utilized in this scenario, which is small enough to largely eliminate residual ISI during the second write-pass.

2. Variable Backoff refers to the procedure of choosing $\eta$ differently for different cells (in a much less specific way than conducted in full write-precompensation). Since the ISI incurred by odd-page cells and even-page cells are inherently different in magnitude (as described with respect to FIG. 8), different values of $\eta$ are used for each of these (denoted by $\eta_o$ and $\eta_e$, respectively, in the following). The value of $\eta_o$ is obtained from the ISI characterization using the maximum ISI value expected for an odd-page cell as, $$\eta_o = sl_\downarrow^{(o)} \cdot \max_{s \in S} s + b_\downarrow^{(o)} + \epsilon, \quad (7)$$

where $\epsilon$ is a small value to account for the variability of the ISI. Note here that since, in practice, no odd-page cell will be written above a value of $$\tilde{s}_{o,max} = \max_{s \in S} s - \eta_o,$$

equation (7) is a conservative estimate of the required backoff.

Using the value of $\eta_o$ computed above, the maximum amount of ISI expected by an even-page cell is used to compute $\eta_e$ as, $$\eta_c = (sl^{(e)}_{\rightarrow} + sl^{(e)}_{\leftarrow}) \cdot \tilde{s}_{o,max} + (b^{(e)}_{\rightarrow} + b^{(e)}_{\leftarrow}) + sl^{(e)}_{\uparrow} \cdot \max_{s \in S} s + b^{(e)}_{\uparrow} + \epsilon. \quad (8)$$

As in the odd-page scenario, the fact that no even-page cell will be written above a value of $$\tilde{s}_{e,max} = \max_{s \in S} s - \eta_e.$$

renders equation (8) a conservative estimate of the required backoff.

Figure 8:
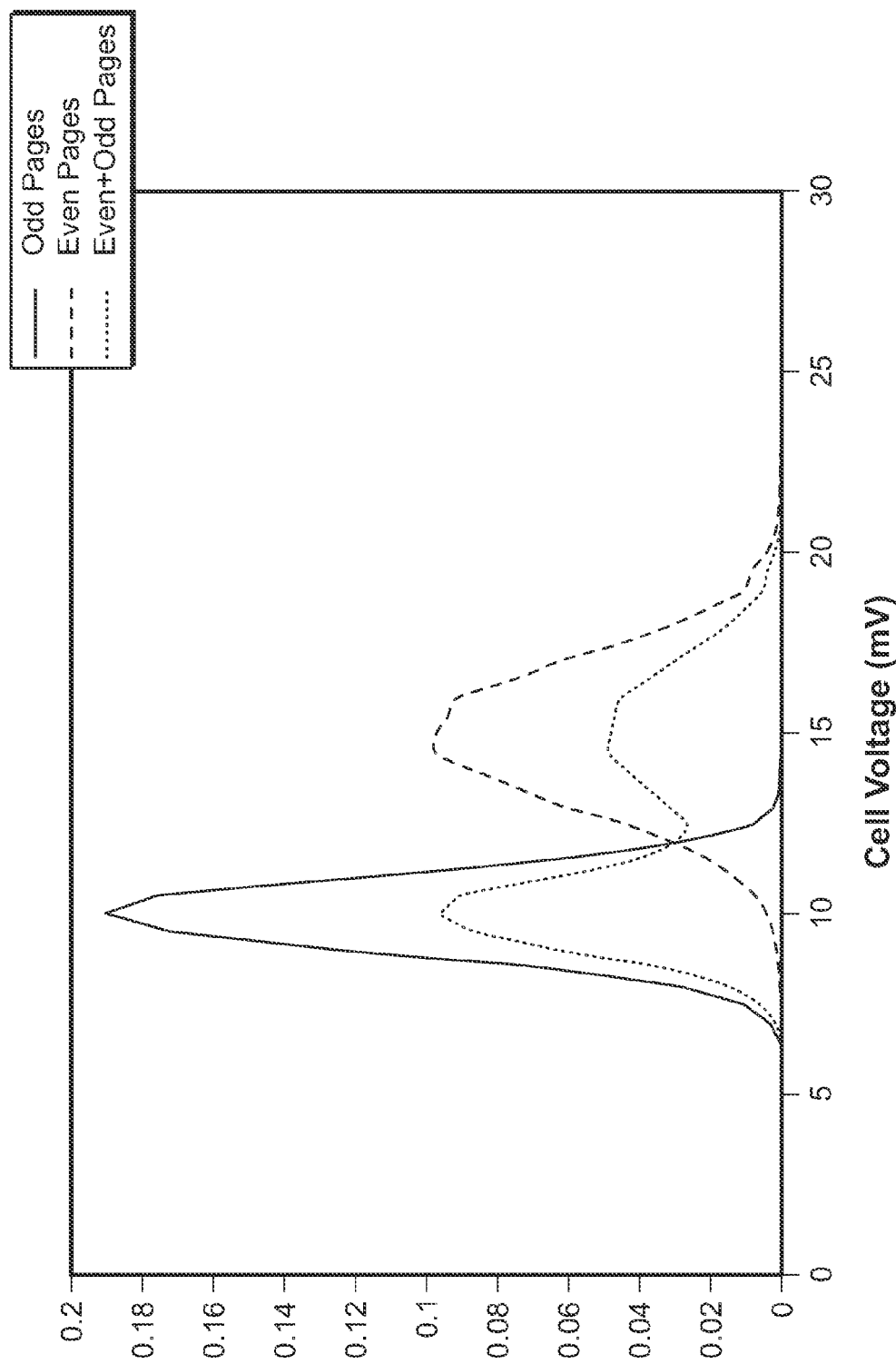
FIG. 8 is an example of a plot illustrating histograms of the cells from odd, even, and odd+even-pages.

FIG. 8 is an example of a plot illustrating histograms of the cells from odd, even, and odd+even-pages. The magnitude of the ISI incurred by even-page cells exceeds that of odd-page cells and, therefore, must be backed-off by a larger voltage.

In one example, histograms for even and odd pages are obtained, for example similar to those shown in FIG. 8. The means (e.g., $\mu_e$ and $\mu_o$) and distributions (e.g., $\sigma^2_e$ and $\sigma^2_o$) of the two histograms are used in some embodiments to determine an appropriate value for $\eta_e$ and $\eta_o$. For example, $\eta_e = \mu_e + f(\sigma^2_e)$. As the distribution of the even histogram grows wider (i.e., corresponding to a larger $\sigma^2_e$), $f(\sigma^2_e)$ will become larger, resulting in a larger $\eta_e$. The same mean but with a "tighter" distribution (i.e., a smaller $\sigma^2_e$) results in a lower backoff value $\eta_e$ since the behavior is more deterministic. A function can be used for the odd page case.

Incorporation of Program (Write) Disturb

The write-process is conducted by applying electrical pulses to a word-line, which acts to induce an increase in voltage across the floating-gates of its constituent cells. Each cell along that word-line is either "turned-on" (i.e., a net voltage is placed across its floating-gate), a case in which it accepts additional voltage across its floating-gate, or "turned-off" (i.e., no net voltage is placed across its floating-gate), a case in which no additional voltage is accepted across its floating-gate. In practice, however, even cells which are "turned-off" do accept small amounts of additional charge across their floating-gates. This phenomenon is referred to as program (write) disturb.

The write-process for a page begins with all cells at a starting (e.g., low) electric potential. As electrical pulses are applied to the word-line, each cell increases in voltage until a point at which a given cell has reached its desired potential. At this point, this cell is "turned-off" and all remaining cells are increased in voltage to their, respective, intended voltage levels. Thus, cells which are intended for the lowest voltage levels experience the most significant program disturb since they experience the greatest number of additional pulses after reaching their desired values and after being "turned-off".

The effect of program disturb is largely deterministic and depends most heavily upon the difference of the intended voltage level of a cell and the largest voltage level utilized along a word-line. Thus because of these properties, some or all of the techniques outlined above with respect to ISI can be applied to program (write) disturb. In some embodiments, quantitatively, the voltage increase due to program disturb is determined (experimentally) by first reading back the values of a number of cells written to level a $s_i$ immediately after they reach that level. The same cells are then re-read at the completion of the word-line write-process and the average increase in voltage is computed (the technique is detailed below). This is similar to the examples described above for ISI. Voltage levels are measure pre-ISI/pre-program disturb and then they are measure post-ISI/post-program disturb. These measurements are then used to mitigate the effect of ISI/program disturb.

Program-Disturb Characterization Method

1. For a given signal set $S=\{s_1, \ldots, s_L\}$, choose a cell spacing $d>1$ and page number m.
2. Randomly generate a vector of write-levels $v=(v_1, \ldots, v_N)$, where d cells are written to 0 Volts in between each cell written to a value in S (i.e. is non-zero only for indices $i \in I=\{1, d+2, 2d+3, 3d+4, 4d+5, \ldots\}$.)
3. Denote by $I_1, I_2, \ldots, I_L$ the sets of indices in s written to each of the respective L levels, i.e., $$I_j = \{k | v_k = s_j\}, \quad (9)$$

where $I = I_1 \cup I_2 \cup \ldots \cup I_L$.
4. FOR i=1, 2, ..., L
 write the vector $v^{(i)}=(v_1^{(i)}, v_2^{(i)}, \ldots, v_N^{(i)})$ to page m, where $v_k^{(i)} = s_i, \forall k \in I_i \cup I_{i+1} \cup \ldots \cup I_L$.
 readback voltages for all indices $j \in I_i$ and denote the readback as $r^{(i)}$
END FOR
5. for i=1, 2, ..., L, readback voltages for all indices $j \in I_i$ and denote the readback as $\tilde{r}^{(i)}$
6. for i=1, 2, ..., L, compute $\gamma_{s_i}=\text{mean}(\tilde{r}^{(i)} - r^{(i)})$.

Compensating for this phenomenon is accomplished by using the computed program disturb values and adjusting the voltage backoff for each appropriately. Since the behavior of program disturb is significantly different between each write-interleave, the above procedure in some embodiments is carried-out for each interleave in the order in which pages are written. For the two-page interleave example, it is first be carried out for an even-page and then for an odd-page, the values for which are denoted by $\gamma_{(e, s_i)}$ and $\gamma_{(o, s_i)}$. Thus, incorporating program disturb into either Variable Backoff or Write Precompensation is accomplished by making the backoffs level-dependent (i.e., the backoff for any cell in an even (odd) page written to level $s_i$ is increased by $\gamma_{(e, s_i)}$ ($\gamma_{(o, s_i)}$)).

EXAMPLE RESULTS

In various embodiments, any of the above described techniques may be used:

Technique 1. Write Precompensation—The value written to a cell is precompensated using the formulas for induced change in voltage (expected ISI) on the victim cell as a function of change in voltage on the interfering cell. Different formulas are used depending on if the victim cell is an odd page cell or an even page cell. In some embodiments, the expected ISI is subtracted from the desired value to produce a modified write value, and the modified write value is written to the cell.

In the case of a multiple pass write, the first (coarse) write is precompensated using the computed expected ISI as the backoff values. In some embodiments, the backoff value for a cell is subtracted from the desired coarse write value to produce a modified coarse write value, and the modified coarse write value is written to the cell.

Technique 2. Multiple Pass Write—To save computation compared to Technique 2, the first (coarse) write is precompensated by choosing the same backoff for all odd page cells and the same backoff for all even page cells. The maximum amount of ISI expected for an odd page cell and an even page cell are selected as the respective backoff values. In some embodiments, the backoff value for a cell is subtracted from the desired coarse write value to produce a modified coarse write value, and the modified coarse write value is written to the cell.

Technique 3. Accounting for Program Disturb—The backoff value is also dependent on the difference between the desired value written to the cell and the largest voltage level utilized along a word-line. The larger the difference, the larger the program disturb value that is added to the backoff value to compensate for program disturb. In some embodiments, the program disturb value is added to the backoff value to give a modified backoff value. The modified backoff value for a cell is subtracted from the desired write value to produce a modified write value, and the modified write value is written to the cell. Technique 3 can be used in combination with any one of techniques 1-2.

Figure 9:
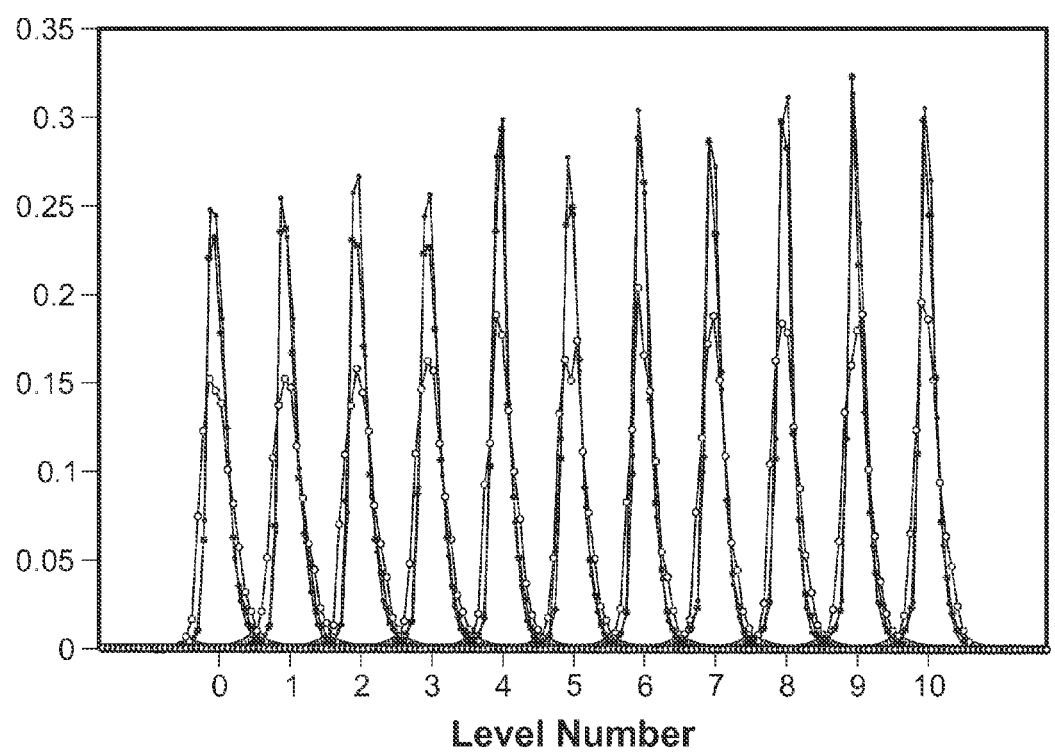
FIG. 9 is an example of a plot illustrating a histogram of the data obtained from a solid-state storage device for 3 write schemes.

As an example of the effectiveness of the ISI characterization, as well as the write-precompensation and variable-backoff write methodologies, data was collected from a solid-state storage device (note that the program disturb compensation was also used to obtain the results provided). In such, multiple blocks of data (randomly selected from a signal-set consisting of 11 levels) were written (using a two-pass write scheme) and read back to establish distributions for each write level. The results of this effort are shown in FIG. 9, and the standard deviation of each write level (in mV and in dBm) are provided in Table I. Table I includes four columns. The first column indicates the level written. The second column indicates the standard deviation when no precompensation is used. The third column corresponds to Techniques 2 and 3. The fourth column corresponds to Techniques 1 and 3. As can be seen, the variable backoff scheme shows a 2 dB improvement in signal-to-noise ratio over the case of no precompensation. An additional 0.75-0.8 dB may also be gained by using a full write-precompensation strategy.

TABLE I

Comparison of read-back standard deviations for no precompensation, variable-backoff compensation, and full write-precompensation for a two-pass write scheme.

| Level | $\sigma_{noprecompensation}$ (mV, dBm) | $\sigma_{variable\text{-}backoff}$ (mV, dBm) | $\sigma_{write\text{-}precomp}$ (mV, dBm) |
|---|---|---|---|
| 0 | (55.27, 34.85) | (41.99, 32.46) | (38.28, 31.65) |
| 1 | (54.88, 34.78) | (42.57, 32.58) | (39.45, 31.92) |
| 2 | (52.73, 34.44) | (42.38, 32.54) | (37.89, 31.57) |
| 3 | (51.36, 34.21) | (40.82, 32.21) | (37.30, 31.43) |
| 4 | (46.67, 33.38) | (37.69, 31.52) | (34.37, 30.72) |
| 5 | (48.24, 33.66) | (38.28, 31.65) | (34.76, 30.82) |
| 6 | (45.89, 33.23) | (36.13, 31.15) | (33.20, 30.42) |
| 7 | (47.26, 33.49) | (36.71, 31.29) | (34.57, 30.77) |
| 8 | (44.72, 33.01) | (35.54, 31.01) | (31.83, 30.05) |
| 9 | (45.50, 33.16) | (37.50, 31.48) | (33.39, 30.47) |
| 10 | (45.70, 33.19) | (35.74, 31.06) | (31.64, 30.00) |

It should be noted that this reduction in standard deviation for each write-level directly translates into the ability to more closely space the write levels without a significant degradation in decoding performance. Since the voltage range in which a cell may be written is constrained by the process technology, more closely spacing write levels allows for an overall increase in the size of the signal-set utilized, thus increasing the information capacity of a cell. These results correspond to a 55 nm solid state storage device. Higher capacity devices (e.g., 34 nm) yield even better improvements.

FIG. 9 is an example of a plot illustrating a histogram of the data obtained from a solid-state storage device for 3 write schemes. The intended voltage levels are indicated as (0, 1, . . . , 10) and the 3 sets of histograms are given for (o) no precompensation, (*) variable-backoff compensation, and (.) full write-precompensation. The standard deviations of each level for each strategy is provided in Table I.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for writing data, comprising:
anticipating an amount of additional voltage on an affected cell of a solid-state storage device caused by a write to an interfering cell in the solid-state storage device;
determining a modified write value for the affected cell based at least in part on a desired stored value for the affected cell and the anticipated amount of additional voltage; and
prior to the write to the interfering cell which causes the additional voltage on the affected cell, writing the modified write value to the affected cell.

2. A method as recited in claim 1, wherein anticipating is based at least in part on a voltage written to the interfering cell.

3. A method as recited in claim 1, wherein anticipating includes:
in the event the affected cell is associated with an even page, anticipating includes using a first estimation process; and
in the event the affected cell is associated with an odd page, anticipating includes using a second estimation process.

4. A method as recited in claim 1, wherein anticipating is based at least in part on a difference between the desired stored value and a largest voltage level utilized along a word line.

5. A method as recited in claim 1, wherein the modified write value is a coarse write value for a coarse write of a multiple pass write.

6. A method as recited in claim 1, wherein anticipating includes: writing a first voltage to the affected cell, reading back a baseline voltage level from the affected cell after writing the first voltage, writing a second voltage to the interfering cell after reading back the first read voltage, and reading back an interfered voltage level from the affected cell after writing the second voltage.

7. A method as recited in claim 6, wherein anticipating further includes computing the difference between the baseline voltage level and the interfered voltage level.

8. A method as recited in claim 1, wherein anticipating includes:
writing a first plurality of voltages to a plurality of affected cells;
reading back a plurality of baseline voltage levels from the plurality of affected cells after writing the first plurality;
writing a second plurality of voltages to an plurality of interfering cells after reading back the first plurality;
reading back a plurality of interfered voltage levels from the victim cell after writing the second plurality; and
averaging the differences.

9. A method as recited in claim 1, wherein determining includes subtracting the anticipated amount of additional voltage from the desired stored value for the victim cell.

10. A method as recited in claim 1, wherein the solid-state storage device is 2-page interleaved and the method further comprises:

for an even-paged affected cell:
  anticipating (1) an amount of additional voltage from a cell to the left of the even-paged affected cell, (2) an amount of additional voltage from a cell to the right of the even-paged affected cell, and (3) an amount of additional voltage from a cell above the even-paged affected cell; and
  summing the amount of additional voltage from the cell to the left of the even-paged affected cell, the amount of additional voltage from the cell to the right of the even-paged affected cell, and the amount of additional voltage from the cell above the even-paged affected cell and
for an odd-paged affected cell: anticipating an amount of additional voltage from a cell above the odd-paged affected cell.

11. A method as recited in claim 1, wherein the solid-state storage device is 0-page interleaved, or un-interleaved.

12. A method as recited in claim 1, wherein anticipating includes one or more of the following: generating a histogram; obtaining a mean for the histogram and anticipating the amount of additional voltage based at least in part on the mean; or obtaining a variance for the histogram and anticipating the amount of additional voltage based at least in part on the variance.

13. A method as recited in claim 1, wherein anticipating includes generating a linear function with the voltage written to one of said one or more of the other cells as the x-axis and the amount of additional voltage as the y-axis.

14. A method as recited in claim 13, wherein generating the linear function includes minimizing a mean-squared error.

15. A system for writing data, comprising:
  a processor configured to:
    anticipate an amount of additional voltage on an affected cell of a solid-state storage device caused by a write to an interfering cell in the solid-state storage device;
    determine a modified write value for the affected cell based at least in part on a desired stored value for the affected cell and the anticipated amount of additional voltage; and
    prior to the write to the interfering cell which causes the additional voltage on the affected cell, write the modified write value to the affected cell; and
  a memory coupled to the processor and configured to provide the processor with instructions.

16. A computer program product for writing data, the computer program product being embodied in a non-transitory computer readable medium and comprising computer instructions for:
  anticipating an amount of additional voltage on an affected cell of a solid-state storage device caused by a write to an interfering cell in the solid-state storage device;
  determining a modified write value for the affected cell based at least in part on a desired stored value for the affected cell and the anticipated amount of additional voltage; and
  prior to the write to the interfering cell which causes the additional voltage on the affected cell, writing the modified write value to the affected cell.

17. A method as recited in claim 1, wherein the solid-state storage device is 1-page interleaved.

18. A method as recited in claim 1, wherein the solid-state storage device is multiple-page interleaved.

19. A method as recited in claim 1 further comprising writing to the interfering cell, causing the additional voltage on the affected cell.

20. A system as recited in claim 15, wherein the processor is further configured to write to the interfering cell, causing the additional voltage on the affected cell.

21. A computer program product as recited in claim 16 further comprising computer instructions for writing to the interfering cell, causing the additional voltage on the affected cell.

* * * * *

UNITED STATES PATENT AND TRADEMARK OFFICE
CERTIFICATE OF CORRECTION

PATENT NO.        : 8,477,537 B2
APPLICATION NO.   : 13/316042
DATED             : July 2, 2013
INVENTOR(S)       : Bellorado et al.

Page 1 of 1

It is certified that error appears in the above-identified patent and that said Letters Patent is hereby corrected as shown below:

In the claims
In column 13, line 13, claim 10, after "affected cell" insert -- ; --.

Signed and Sealed this
Twenty-second Day of March, 2016

Michelle K. Lee
*Director of the United States Patent and Trademark Office*